United States Patent
Lyon et al.

(10) Patent No.: US 9,298,311 B2
(45) Date of Patent: Mar. 29, 2016

(54) TRACKPAD SENSITIVITY COMPENSATION

(75) Inventors: Benjamin B. Lyon, San Jose, CA (US); Steve P. Hotelling, San Jose, CA (US)

(73) Assignee: Apple Inc., Cupertino, CA (US)

( * ) Notice: Subject to any disclaimer, the term of this patent is extended or adjusted under 35 U.S.C. 154(b) by 2233 days.

(21) Appl. No.: 11/165,951

(22) Filed: Jun. 23, 2005

(65) Prior Publication Data
US 2006/0290677 A1 Dec. 28, 2006

(51) Int. Cl.
*G06F 3/045* (2006.01)
*G06F 3/041* (2006.01)
*G06F 3/044* (2006.01)

(52) U.S. Cl.
CPC .............. *G06F 3/0418* (2013.01); *G06F 3/044* (2013.01); *H03K 2217/96073* (2013.01)

(58) Field of Classification Search
CPC ..................................................... G06F 3/044
USPC ............ 345/156, 173, 174; 178/18.01–19.07; 463/37
See application file for complete search history.

(56) References Cited

U.S. PATENT DOCUMENTS

| | | | |
|---|---|---|---|
| 3,783,394 A * | 1/1974 | Avery | 327/42 |
| 4,115,865 A | 9/1978 | Beauvais et al. | |
| 4,310,840 A * | 1/1982 | Williams et al. | 345/14 |
| 4,449,193 A | 5/1984 | Tournois | |
| 4,484,346 A | 11/1984 | Sternberg et al. | |
| 4,532,606 A | 7/1985 | Phelps | |
| 4,559,618 A | 12/1985 | Houseman et al. | |
| 4,564,952 A | 1/1986 | Karabinis et al. | |
| 4,581,760 A | 4/1986 | Schiller et al. | |
| 4,594,673 A | 6/1986 | Holly | |
| 4,622,653 A | 11/1986 | McElroy | |
| 4,669,054 A | 5/1987 | Schlunt et al. | |
| 4,670,858 A | 6/1987 | Almy | |
| 4,694,404 A | 9/1987 | Meagher | |
| 4,695,973 A | 9/1987 | Yu | |
| 4,758,982 A | 7/1988 | Price | |
| 4,783,829 A | 11/1988 | Miyakawa et al. | |
| 4,794,559 A | 12/1988 | Greenberger | |
| 4,825,391 A | 4/1989 | Merz | |
| 4,841,467 A | 6/1989 | Ho et al. | |
| 4,847,789 A | 7/1989 | Kelly et al. | |
| 4,888,583 A | 12/1989 | Ligocki et al. | |

(Continued)

FOREIGN PATENT DOCUMENTS

| | | |
|---|---|---|
| EP | 0166577 | 1/1986 |
| EP | 0870282 | 5/2003 |
| JP | 2000-163031 A | 6/2000 |
| JP | 2002-342033 A | 11/2002 |
| WO | WO 90/04849 | 5/1990 |
| WO | WO 95/27263 | 10/1995 |

OTHER PUBLICATIONS

Akeley, K., "RealityEngine Graphics", Computer Graphics Proceedings, Annual Conference Series, pp. 109-116, Aug. 1-6, 1993.

(Continued)

*Primary Examiner* — Claire X Pappas
*Assistant Examiner* — Robert Stone
(74) *Attorney, Agent, or Firm* — Morrison & Foerster LLP

(57) ABSTRACT

A device compensating for a loss in sensitivity of a sensor, such as a trackpad. The device may be standalone, integrated with the trackpad itself, or within the associated integrated circuit designed to measure relative electrode capacitances. The embodiment generally employs a current source to negatively compensate for the current available to charge at least one capacitor (or other storage device) in the trackpad.

23 Claims, 10 Drawing Sheets

(56) References Cited

U.S. PATENT DOCUMENTS

| | | |
|---|---|---|
| 4,888,712 A | 12/1989 | Barkans et al. |
| 4,890,242 A | 12/1989 | Sinha et al. |
| 4,945,500 A | 7/1990 | Deering |
| 4,961,581 A | 10/1990 | Barnes et al. |
| 4,970,636 A | 11/1990 | Snodgrass et al. |
| 4,996,666 A | 2/1991 | Duluk, Jr. |
| 4,998,286 A | 3/1991 | Tsujiuchi et al. |
| 5,008,497 A * | 4/1991 | Asher ................... 178/18.05 |
| 5,031,038 A | 7/1991 | Guillemot et al. |
| 5,040,223 A | 8/1991 | Kamiya et al. |
| 5,050,220 A | 9/1991 | Marsh et al. |
| 5,054,090 A | 10/1991 | Knight et al. |
| 5,067,162 A | 11/1991 | Driscoll, Jr. et al. |
| 5,083,287 A | 1/1992 | Obata et al. |
| 5,123,084 A | 6/1992 | Prevost et al. |
| 5,123,085 A | 6/1992 | Wells et al. |
| 5,128,888 A | 7/1992 | Tamura et al. |
| 5,129,051 A | 7/1992 | Cain |
| 5,129,060 A | 7/1992 | Pfeiffer et al. |
| 5,133,052 A | 7/1992 | Bier et al. |
| 5,146,592 A | 9/1992 | Pfeiffer et al. |
| 5,189,712 A | 2/1993 | Kajiwara et al. |
| 5,220,220 A * | 6/1993 | Tse et al. ................. 327/553 |
| 5,245,700 A | 9/1993 | Fossum |
| 5,247,586 A | 9/1993 | Gobert et al. |
| 5,265,222 A | 11/1993 | Nishiya et al. |
| 5,278,948 A | 1/1994 | Luken, Jr. |
| 5,289,567 A | 2/1994 | Roth |
| 5,293,467 A | 3/1994 | Buchner et al. |
| 5,295,235 A | 3/1994 | Newman |
| 5,299,139 A | 3/1994 | Baisuck et al. |
| 5,315,537 A | 5/1994 | Blacker |
| 5,319,743 A | 6/1994 | Dutta et al. |
| 5,338,200 A | 8/1994 | Olive |
| 5,347,619 A | 9/1994 | Erb |
| 5,363,475 A | 11/1994 | Baker et al. |
| 5,365,461 A * | 11/1994 | Stein et al. ................. 700/298 |
| 5,369,734 A | 11/1994 | Suzuki et al. |
| 5,374,787 A * | 12/1994 | Miller et al. ............ 178/18.06 |
| 5,394,516 A | 2/1995 | Winser |
| 5,402,532 A | 3/1995 | Epstein et al. |
| 5,448,690 A | 9/1995 | Shiraishi et al. |
| 5,455,900 A | 10/1995 | Shiraishi et al. |
| 5,481,669 A | 1/1996 | Poulton et al. |
| 5,483,261 A | 1/1996 | Yasutake |
| 5,488,204 A | 1/1996 | Mead et al. |
| 5,493,644 A | 2/1996 | Thayer et al. |
| 5,509,110 A | 4/1996 | Latham |
| 5,535,288 A | 7/1996 | Chen et al. |
| 5,544,306 A | 8/1996 | Deering et al. |
| 5,546,194 A | 8/1996 | Broemmelsiek |
| 5,572,634 A | 11/1996 | Duluk, Jr. |
| 5,574,835 A | 11/1996 | Duluk, Jr. et al. |
| 5,574,836 A | 11/1996 | Broemmelsiek |
| 5,579,455 A | 11/1996 | Greene et al. |
| 5,596,686 A | 1/1997 | Duluk, Jr. |
| 5,613,050 A | 3/1997 | Hochmuth et al. |
| 5,621,866 A | 4/1997 | Murata et al. |
| 5,623,628 A | 4/1997 | Brayton et al. |
| 5,664,071 A | 9/1997 | Nagashima |
| 5,669,010 A | 9/1997 | Duluk, Jr. |
| 5,684,939 A | 11/1997 | Foran et al. |
| 5,699,497 A | 12/1997 | Erdahl et al. |
| 5,710,876 A | 1/1998 | Peercy et al. |
| 5,734,806 A | 3/1998 | Narayanaswami |
| 5,751,291 A | 5/1998 | Olsen et al. |
| 5,767,589 A | 6/1998 | Lake et al. |
| 5,767,859 A | 6/1998 | Rossin et al. |
| 5,778,245 A | 7/1998 | Papworth et al. |
| 5,798,770 A | 8/1998 | Baldwin |
| 5,825,352 A | 10/1998 | Bisset et al. |
| 5,828,378 A | 10/1998 | Shiraishi |
| 5,835,079 A | 11/1998 | Shieh |
| 5,841,447 A | 11/1998 | Drews |
| 5,850,225 A | 12/1998 | Cosman |
| 5,852,451 A | 12/1998 | Cox et al. |
| 5,854,631 A | 12/1998 | Akeley et al. |
| 5,860,158 A | 1/1999 | Pai et al. |
| 5,864,342 A | 1/1999 | Kajiya et al. |
| 5,870,095 A | 2/1999 | Albaugh et al. |
| RE36,145 E | 3/1999 | DeAguiar et al. |
| 5,880,411 A | 3/1999 | Gillespie et al. |
| 5,880,717 A * | 3/1999 | Chan et al. ................... 345/173 |
| 5,880,736 A | 3/1999 | Peercy et al. |
| 5,889,997 A | 3/1999 | Strunk |
| 5,920,326 A | 7/1999 | Rentschler et al. |
| 5,936,629 A | 8/1999 | Brown et al. |
| 5,949,424 A | 9/1999 | Cabral et al. |
| 5,949,428 A | 9/1999 | Toelle et al. |
| 5,977,977 A | 11/1999 | Kajiya et al. |
| 5,977,987 A | 11/1999 | Duluk, Jr. |
| 5,990,904 A | 11/1999 | Griffin |
| 6,002,410 A | 12/1999 | Battle |
| 6,002,412 A | 12/1999 | Schinnerer |
| 6,046,746 A | 4/2000 | Deering |
| 6,075,520 A * | 6/2000 | Inoue et al. ................... 345/173 |
| 6,084,591 A | 7/2000 | Aleksic |
| 6,111,582 A | 8/2000 | Jenkins |
| 6,118,452 A | 9/2000 | Gannett |
| 6,128,000 A | 10/2000 | Jouppi et al. |
| 6,167,143 A | 12/2000 | Badique |
| 6,167,486 A | 12/2000 | Lee et al. |
| 6,188,391 B1 | 2/2001 | Seely et al. |
| 6,201,540 B1 | 3/2001 | Gallup et al. |
| 6,204,859 B1 | 3/2001 | Jouppi et al. |
| 6,216,004 B1 | 4/2001 | Tiedemann et al. |
| 6,228,730 B1 | 5/2001 | Chen et al. |
| 6,229,553 B1 | 5/2001 | Duluk, Jr. et al. |
| 6,243,488 B1 | 6/2001 | Penna |
| 6,243,744 B1 | 6/2001 | Snaman, Jr. et al. |
| 6,246,415 B1 | 6/2001 | Grossman et al. |
| 6,259,452 B1 | 7/2001 | Coorg et al. |
| 6,259,460 B1 | 7/2001 | Gossett et al. |
| 6,263,493 B1 | 7/2001 | Ehrman |
| 6,268,875 B1 | 7/2001 | Duluk, Jr. et al. |
| 6,275,235 B1 | 8/2001 | Morgan, III |
| 6,278,888 B1 * | 8/2001 | Hayes et al. ................... 455/566 |
| 6,285,378 B1 | 9/2001 | Duluk, Jr. |
| 6,288,730 B1 | 9/2001 | Duluk, Jr. et al. |
| 6,310,610 B1 | 10/2001 | Beaton et al. |
| 6,323,846 B1 | 11/2001 | Westerman et al. |
| 6,331,856 B1 | 12/2001 | Van Hook et al. |
| 6,476,807 B1 | 11/2002 | Duluk, Jr. et al. |
| 6,525,737 B1 | 2/2003 | Duluk, Jr. et al. |
| RE38,078 E | 4/2003 | Duluk, Jr. |
| 6,552,723 B1 | 4/2003 | Duluk, Jr. et al. |
| 6,577,305 B1 | 6/2003 | Duluk, Jr. et al. |
| 6,577,317 B1 | 6/2003 | Duluk, Jr. et al. |
| 6,597,363 B1 | 7/2003 | Duluk, Jr. et al. |
| 6,614,444 B1 | 9/2003 | Duluk, Jr. et al. |
| 6,650,327 B1 | 11/2003 | Airey et al. |
| 6,671,747 B1 | 12/2003 | Benkual et al. |
| 6,686,786 B2 * | 2/2004 | Keeth et al. ................... 327/198 |
| 6,690,387 B2 | 2/2004 | Zimmerman et al. |
| 6,693,639 B2 | 2/2004 | Duluk, Jr. et al. |
| 6,697,063 B1 | 2/2004 | Zhu |
| 6,717,576 B1 | 4/2004 | Duluk, Jr. et al. |
| 6,771,264 B1 | 8/2004 | Duluk et al. |
| 7,015,894 B2 | 3/2006 | Morohoshi |
| 7,184,064 B2 | 2/2007 | Zimmerman et al. |
| 7,663,607 B2 | 2/2010 | Hotelling et al. |
| 8,479,122 B2 | 7/2013 | Hotelling et al. |
| 2003/0210809 A1 * | 11/2003 | Kim ................... 382/124 |
| 2004/0130552 A1 | 7/2004 | Duluk, Jr. et al. |
| 2004/0178996 A1 * | 9/2004 | Kurashima et al. ........... 345/173 |
| 2004/0178997 A1 * | 9/2004 | Gillespie et al. ............. 345/173 |
| 2006/0197753 A1 | 9/2006 | Hotelling |

OTHER PUBLICATIONS

Angel, E., "Interactive Computer Graphics: A Top-Down Approach with OpenGl", ISBN: 0201855712, Addison-Wesley, pp. 241, 242, 277 and 278, 1997.

(56) References Cited

OTHER PUBLICATIONS

Carpenter, L., "The A-buffer, An Antialaised Hidden Surface Method", Computer Graphics, vol. 18, No. 3, pp. 103-108, Jul. 1984.
Clark, J., "Hierarchical Geometric Models for Visible Surface Algorithms", Communications of the ACM, vol. 19, No. 10, pp. 547-554, Oct. 1976.
Clark et al., "Distributed Proc in High Performance Smart Image Memory", LAMDA 4th Quarter, pp. 40-45, Oct. 1990.
Cook et al., "The Reyes Image Rendering Architecture", Computer Graphics, vol. 21, No. 4, pp. 95-102, Jul. 1987.
Das et al., "A systolic algorithm for hidden surface removal", Parallel Computing, vol. 15, pp. 277-289, 1990.
Deering et al., "Leo: A System for Cost Effective 3D Shaded Graphics", Computer Graphics Proceedings, Annual Conference Series, pp. 101-108, Aug. 1-6, 1993.
Demetrescu, S., "High Speed Image Rasterization Using a Highly Parallel Smart Bulk Memory", Stanford Tech Report, pp. 83-244, Jun. 1983.
Demetrescu, S., "High Speed Image Rasterization Using Scan Line Access Memories", Chapel Hill Conference on VLSI, pp. 221-243, 1985.
Duluk et al., "VLSI Processors for Signal Detection in SETI", Presented at XXXVIIth International Astronautical Congress, Innsbruck, Austria, Oct. 4-11, 1986.
Foley et al., "Computer Graphics: Principles and Practice", Addison-Wesley Professional, Second Edition, 1990.
Franklin, W., "A Linear Time Exact Hidden Surface Algorithm", Computer Graphics, pp. 117-123, Jul. 1980.
Franklin et al., "Parallel Object-Space Hidden Surface Removal", Computer Graphics, vol. 24, No. 4, pp. 87-94, Aug. 1990.
Fuchs et al., "Pixel-Planes 5: A Heterogeneous Multiprocessor Graphics System Using Processor-Enhanced Memories", Computer Graphics, vol. 23, No. 3, pp. 79-88, Jul. 1989.
Gharachorloo et al., "A Characterization of Ten Rasterization Techniques", Computer Graphics, vol. 23, No. 3, pp. 355-368, Jul. 1989.
Gharachorloo et al., "Super Buffer: A Systolic VLSI Graphics Engine for Real Time Raster Image Generation", Chapel Hill Conference on VLSI, Computer Science Press, pp. 285-305, 1985.
Gharachorloo et al., "Subnanosecond Pixel Rendering with Million Transistor Chips", Computer Graphics, vol. 22, No. 4, pp. 41-49, Aug. 1988.
Gharachorloo et al., "A Million Transistor Systolic Array Graphics Engine", Proceedings of the International Conference on Systolic Arrays, San Diego, CA, pp. 193-202, May 25-27, 1988.
Goris et al., "A Configurable Pixel Cache for Fast Image Generation", IEEE Computer Graphics & Applications, Mar. 1987.
Greene et al., "Hierarchial Z-Buffer Visibility", Computer Graphics Proceedings, Annual Conference Series, pp. 231-238, Aug. 1-6, 1993.
Gupta et al., "A VLSI Architecture for Updating Raster-Scan Displays", Computer Graphics, vol. 15, No. 3, pp. 71-78, Aug. 1981.
Gupta, S., "PS: Polygon Streams, A Distributed Architecture for Incremental Computation Applied to Graphics", Advances in Computer Graphics Hardware IV, ISBN 0387534733, Springer-Verlag, pp. 91-111, May 1, 1991.
Hall, E., "Computer Image Processing and Recognition", Academic Press, pp. 468-484, 1979.
Hu et al., "Parallel Processing Approaches to Hidden-Surface Removal in Image Space", Computer and Graphics, vol. 9, No. 3, pp. 303-317, 1985.
Hubbard, P., "Interactive Collision Detection", Brown University, ACM SIGGRAPH 94, Course 2, Jul. 24-29, 1994.
Jackel, D. "The Graphics PARCUM System: A 3D Memory Based Computer Architecture for Processing and Display of Solid Models", Computer Graphics Forum, vol. 4, pp. 21-32, 1985.
Kaplan et al., "Parallel Processing Techniques for Hidden Surface Removal" SIGGRAPH 1979 Conference Proceedings, p. 300.
Kaufman, A., "A Two-Dimensional Frame Buffer Processor", Advances in Com. Graphics Hardware II, ISBN 0-387-50109-6, Springer-Verlag, pp. 67-83.
Lathrop, "The Way Computer Graphics Work", Chapter 7: Rendering (converting a scene to pixels), Wiley Computer Publishing, John Wiley & Sons, Inc., pp. 93-150, 1997.
Linscott et al., "Artificial Signal Detectors," International Astronomical Union Colloquium No. 99, Lake Balaton, Hungary, Stanford Universtiy, Jun. 15, 1987.
Linscott et al., "Artificial Signal Detectors," Bioastronomy—The Next Steps, pp. 319-355, 1988.
Linscott et al., "The MCSA II—A Broadband, High Resolution, 60 Mchannel Spectrometer," Nov. 1990.
Naylor, B., "Binary Space Partitioning Trees, A Tutorial", (included in the course notes Computational Representations of Geometry), Course 23, ACM SIGGRAPH 94, Jul. 24-29, 1994.
Nishizawa et al., "A Hidden Surface Processor for 3-Dimension Graphics", IEEE, ISSCC, pp. 166-167 and 351, 1988.
Ohhashi et al., "A 32b 3-D Graphics Processor Chip with 10M Pixels/s Gouraud Shading", IEEE, ISSCC, pp. 168-169 and 351, 1988.
Oldfield et al., "Content Addressable Memories for Storing and Processing Recursively Subdivided Images and Trees", Electronics Letters, vol. 23, No. 6, pp. 262-263, Mar. 1987.
Parke, F., "Simulation and Expected Performance of Multiple Processor Z-Buffer Systems", SIGGRAPH '80 Conference Proceedings, pp. 48-56, 1980.
Peercy, et al., "Efficient Bump Mapping Hardware", Computer Graphics Proceedings, Annual Conference Series, pp. 303-306, Aug. 3-8, 1997.
Pineda, J., "A Parallel Algorithm for Polygon Rasterization", SIGGRAPH 1988 Conference Proceedings, Aug. 1988.
Potmesil et al., "The Pixel Machine: A Highly Parallel Image Computer", Computer Graphics, vol. 23, No. 3, pp. 69-78, Jul. 1989.
Poulton et al. "Pixel-Planes: Building a VLSI-Based Graphic System", Chapel Hill Conference on VLSI, Computer Science Press, Inc., pp. 35-60, 1985.
Rao et al., "Discrete Cosine Transform: Algorithms, Advantages, Applications," Academic Press, Inc., pp. 242-247, 1990.
Rossignac et al., "Depth-Buffering Display Techniques for Constructive Solid Geometry", IEEE, Computer Graphics & Applications, pp. 29-39, Sep. 1986.
Samet et al., "Data Structures 59: Hierarchical Data Structures and Algorithms for Computer Graphics", IEEE, Computer Graphics & Applications, pp. 59-75, Jul. 1988.
Schilling et al., "Texram: a Smart Memory for Texturing", IEEE, Computer Graphics and Applications, pp. 32-41, May 1996.
Schneider, B., "Towards A Taxonomy for Display Processors", Advances in Computer Graphics Hardware IV, ISBN 0387534733, Springer-Verlag, pp. 91-111, May 1, 1991.
Schneider et al., "Advances in Computer Graphics Hardware III", Chapter 9, Proof: An Architecture for Rendering in Object Space, ISBN 0387534881, Springer-Verlag, pp. 67-83, Jun. 1, 1991.
Segal, "Hardware sorting chip steps up software pace", Electronic Design, vol. 34, No. 15, pp. 85-91, Jun. 26, 1986.
Shepard et al., "Real-time Hidden Surface Removal in a Flight Simulator", Proceedings of the Pacific Rim Conference on Communications, Compute and Signal Processing, Victoria, CA, pp. 607-610, May 9-10, 1991.
Soderberg et al., "Image Generation Design for Ground-Based Network Training Environments", International Training Equipment Conference, London, May 4-6, 1993.
Sutherland et al., "A Characterization of ten Hidden-Surface Algorithms" Computing Surveys, vol. 6, No. 1, pp. 1-55, Mar. 1974.
Torborg, G., "A Parallel Processor Architecture for Graphics Arithmetic Operations", Computer Graphics, vol. 21, No. 4 pp. 197-204, Jul. 1987.
Warnock, "A Hidden Surface Algorithm for Computer Generated Halftone Pictures", Univerity of Utah Doctoral Thesis, 1969.
Watt, 3D Computer Graphics, "Chapter 4: Reflection and Illumination Models", 2nd Edition, Addison-Wesley, pp. 89-126, 1993.
Weiler et al., "Hidden Surface Removal Using Polygon Area Sorting", vol. 11, No. 2, pp. 214-222, Jul. 1977.
Whelan, D., "A Rectangular Area Filling Display System Architecture", Computer Graphics, vol. 16, No. 3, pp. 147-153, Jul. 1982.

(56) References Cited

OTHER PUBLICATIONS

Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.

Rubine, D.H. (Dec. 1991). "The Automatic Recognition of Gestures," CMU-CS-91-202, Submitted in Partial Fulfillment of the Requirements for the Degree of Doctor of Philosophy in Computer Science at Carnegie Mellon University, 285 pages.

Rubine, D.H. (May 1992). "Combining Gestures and Direct Manipulation," CHI '92, pp. 659-660.

Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.

\* cited by examiner

TRACKPAD SENSITIVITY COMPENSATION

BACKGROUND OF THE INVENTION

1. Technical Field

The present invention relates generally to electronic input devices, and more specifically to trackpads and finger-tracking devices.

2. Background Art

A variety of input devices are used with modern computers. As computers have become more complex, so too has the choice of input devices grown. Certain input devices are more suitable for given tasks, or for use with a given application or computer system. For example, keyboards are typically used for text input, while mice may be used for object selection and/or browsing.

Trackpads are stationary pointing devices often used where space is at a premium, such as with laptop or notebook computers. Trackpads (also referred to as "touchpads") typically provide a small, flat surface over which a user may slide a finger to move a cursor or pointer on a computer screen. In this manner, trackpads provide functionality similar to computer mice. Further, the computing system may equate tapping the trackpad with a finger to clicking a mouse button. Thus, a trackpad may be seen as an equivalent device to a mouse.

Many trackpads couple capacitance through a finger (or other conductive pointer) to operate. In simplest terms, a trackpad includes two layers of electrodes arranged to form a grid, as shown in FIG. 1. For example, the first layer may include horizontally-aligned, strip-shaped electrodes and the second layer may include vertically-aligned, strip-shaped electrodes. The layers are positioned such that one layer overlies the other to form the aforementioned grid. Each of the electrodes is connected to an integrated circuit, for example. The integrated circuit is typically (although not necessarily) located beneath the electrode grid.

As a finger moves across the grid, the finger forms the second plate of a two-plate capacitor. The finger effectively capacitvely couples to the lower electrode, thus changing the capacitance of the electrode beneath the finger by some small amount. In some cases, the change in capacitance is on the order of 1-2%. The integrated circuit (or a computer system associated with the trackpad) continuously measures the capacitance of each electrode in the grid. When the integrated circuit detects an increased capacitance in the electrode at a certain spot of the grid, the position of the finger is located. The integrated circuit may, for example, continuously scan each row and column of the electrode array (grid) to measure capacitances. Alternative trackpads may employ only a single layer of electrodes (i.e., only rows or only columns). The operations described herein, including coupling of the finger to the electrode, generally operate in a similar manner. It should also be noted that multiple fingers, or other capacitively-coupled elements, may be tracked by a single trackpad.

The computing system may use the finger's absolute location on the trackpad to create relative pointer data, thus placing or moving a pointer on a screen associated with the computing system. Similarly, if the integrated circuit detects a finger's presence at one time, no presence at a second time, and the finger's presence in approximately the same area at a third time, the computing system may interpret this as a tap on the trackpad analogous to clicking a mouse button.

Many trackpads, especially those used in notebook computers, are shielded from direct contact with a finger by an insulator layer. For example, aesthetics often demand a metallic look for notebook computers. Such a look may be accomplished either by plating the laptop with metal, or applying metallic flake in a composite, plastic, or paint layer to the laptop. Typically, the metallic finish is an integral part of the laptop body to prevent cracking or peeling with age and/or use. However, many times the metals used to enhance the laptop's appearance act as an insulator between a user's finger and the trackpad. This is especially true where the trackpad surface is finished with such a metallic layer. The presence of this insulation layer may decrease the signal-to-noise ratio of the trackpad (and thus, the trackpad's sensitivity) by up to 60%. In many applications, a mylar label having paint on its backside may be adhered to the trackpad in place of the metallic finish. This paint may have a metallic finish. Similar problems to those described above are presented in such applications.

Additionally, more sensitive trackpads may enhance a user's computing experience by providing more precise input. By providing more precise input and enhancing the range of fingers that may capacitvely couple to the trackpad, a wide range of applications may be opened.

Many present solutions attempt to increase the sensitivity of a trackpad by employing electrodes having a larger surface area in the aforementioned electrode grid. However, a linear relationship exists between a parasitic capacitance experienced by an electrode and the area of the electrode. Thus, as the electrodes used in the electrode array increase in size, so do the parasitic capacitances associated with the array. A parasitic capacitance generally decreases the trackpad sensitivity by decreasing the maximum change in capacitance that may be experienced between the upper and lower electrodes. Further, at some point the parasitic capacitance may be greater than the change in capacitance experienced at a point on the electrode array when the finger touches the trackpad. Thus, if electrodes having a sufficiently large surface area are used, the trackpad may not be able to detect when a finger is placed against it.

Accordingly, there is a need in the art for a trackpad having an improved capacitive sensitivity.

BRIEF SUMMARY OF THE INVENTION

One embodiment of the invention takes the form of a device compensating for a loss in trackpad sensitivity. The device may be standalone, integrated with the trackpad itself, or within the associated integrated circuit designed to measure relative electrode capacitances.

The embodiment generally employs a current source to negatively compensate for the current available to charge at least one capacitor (or electrode) in the trackpad. The functioning of the various electrodes as capacitors is discussed in more detail below. For purposes of this overview, it should be understood that each electrode making up the electrode grid of the trackpad broadly may be viewed as a single capacitor, namely a sense capacitor.

By negatively compensating for the current charging the storage capacitor, the sensitivity of the trackpad may be enhanced. A "negative compensation" of a current, as used herein, is equivalent to a current sink. That is, the present embodiment sinks a portion of the current that would otherwise charge the storage capacitor, thus bleeding off some portion of the charging current.

Typically, when a finger is capacitively coupled to the sense electrode, the impedance of the sensor (as seen by a voltage source) decreases, and thus the charge available to charge the storage capacitor increases. This, in turn, translates to a greater charging current when a finger touches (or is proximate to) the trackpad sensor device, compared to when a finger is not present. As explained in greater detail below, for a given finger at a given position, the charging current ("enhanced current") added through the finger's presence is a constant percentage of the base charging current.

Although impedance is often designated by the letter "Z" and resistance by "R," for convenience's sake the present application employs "R" when discussing both resistance and impedance.

By negatively compensating both base and enhanced currents with a constant current sink, the enhanced current becomes a greater multiple of the base current. This, in turn, increases the sensor's sensitivity to the finger's presence.

One embodiment of the present invention may take the form of a sensor circuit having at least one electrode, a storage device (such as a capacitor) operatively connected to the at least one electrode, a voltage source operative to charge the at least one electrode, and a current source operatively connected to the storage device and sinking at least a portion of a current charging the storage device. In such an embodiment, the storage device is charged from the at least one electrode, and the current source acts to increase a sensitivity of the sensor circuit.

Another embodiment of the invention may take the form of a method for determining a presence of a finger, comprising charging a storage capacitor a first time from a first voltage negatively compensated by a current sink, discharging the storage capacitor, charging the storage capacitor a second time, comparing the first time to the second time, and, in the event the second time is less than the first time, concluding a finger is present.

Various methods and apparatuses for negatively compensating the current charging the storage capacitor are described herein with particular reference to the figures.

DETAILED DESCRIPTION OF THE INVENTION

I. Introduction

One embodiment of the invention takes the form of a device compensating for a loss in sensitivity of a sensor, such as a trackpad. The device may be standalone, integrated with the trackpad itself, or within the associated integrated circuit designed to measure relative electrode capacitances.

The embodiment generally employs a current source to negatively compensate for the current available to charge at least one capacitor (or other storage device) in the trackpad.

The functioning of the various electrodes as capacitors is discussed in more detail below. For purposes of this overview, it should be understood that the electrodes making up the electrode grid of the trackpad broadly may be viewed as two capacitors: a sense capacitor and a storage capacitor.

By negatively compensating for the current charging the storage capacitor, the sensitivity of the trackpad may be enhanced. A "negative compensation" of a current, as used herein, is equivalent to a current sink. That is, the present embodiment sinks a portion of the current that would otherwise charge the storage capacitor, thus bleeding off some portion of the charging current.

Typically, when a finger is capacitively coupled to the sense electrode, the impedance of the sensor (as seen by a voltage source) decreases, and thus the charge available to charge the storage capacitor increases. This, in turn, translates to a greater charging current when a finger touches (or is proximate to) the trackpad sensor device, compared to when a finger is not present. As explained in greater detail below, the charging current ("enhanced current") added through the finger's presence is a constant, regardless of the value of the base charging current.

By negatively compensating both base and enhanced currents with a fixed current sink, the enhanced current becomes a greater multiple of the base current. This, in turn, increases the sensor's sensitivity to the finger's presence.

Various methods and apparatuses for negatively compensating the current charging the storage capacitor are described herein with particular reference to the figures.

2. Capacitive Sensor Operation

Figure 1:
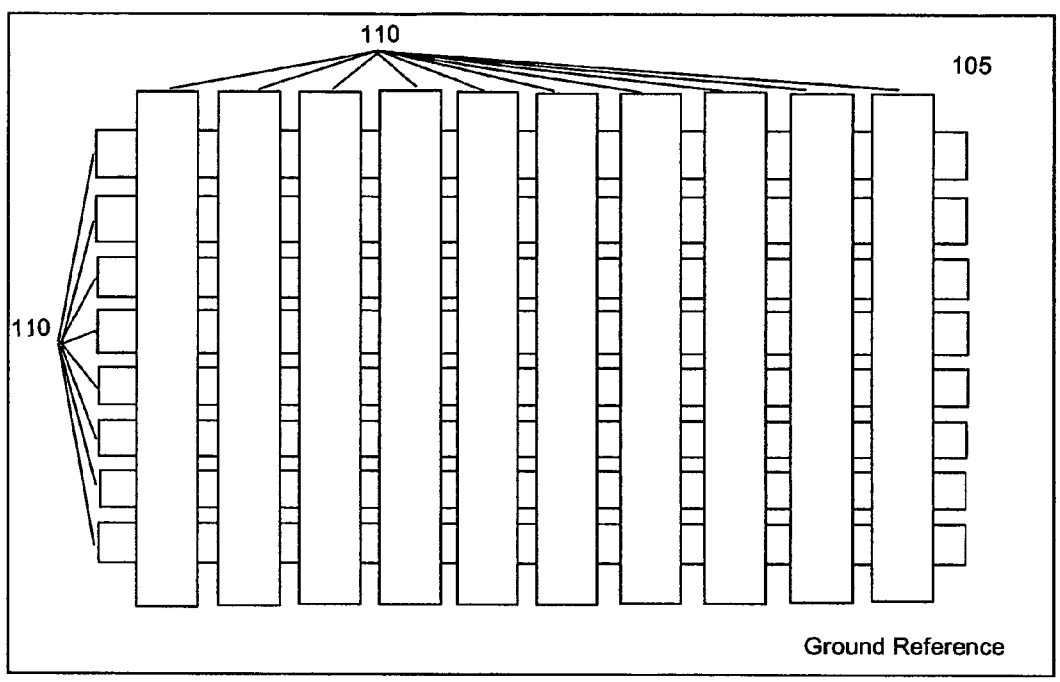
FIG. 1 depicts an exemplary trackpad sensor.
Figure 2:
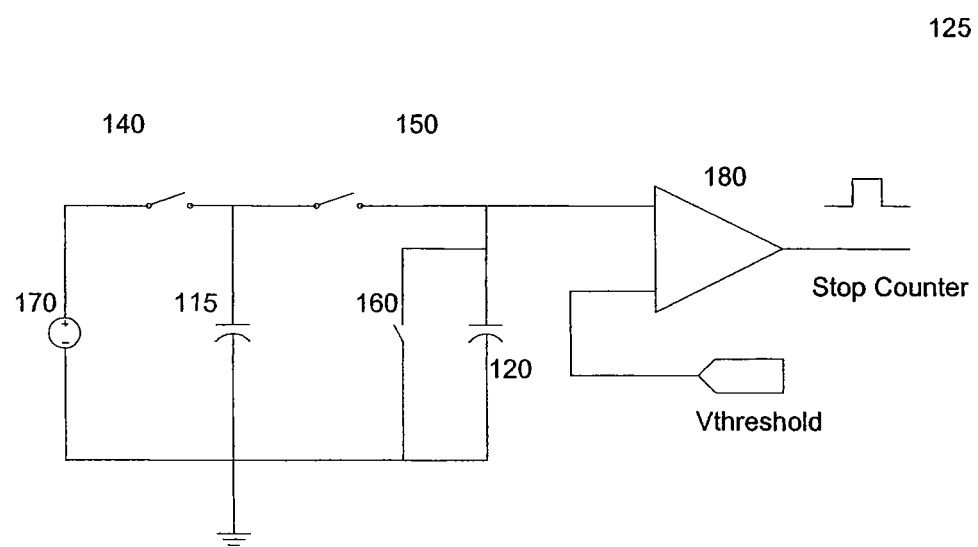
FIG. 2 depicts a circuit equivalent to the trackpad sensor of FIG. 1.

Initially, it should be understood that a typical trackpad sensor 105 having rows and columns of sense electrodes 110, as depicted in FIG. 1, may be represented by an RC switching circuit 125. Such an exemplary circuit represent a single electrode 110 is shown, for example, in FIG. 2. With reference to FIG. 2, the typical trackpad sensor 105 operates by transferring charge from a sense electrode to a storage capacitor 120 at a given frequency f. The charging frequency may be emulated by the first 140, second 150, and third switches 160. Similarly, the sense electrode 110 may be represented by a sense capacitor 115. A voltage source 170 and comparator 180 complete the RC switching circuit model.

The operation of the switching circuit 125 will now be discussed. It should be noted that the sense capacitor 115 may not charge unless the first switch 140 is closed. Similarly, charge cannot be transferred between the sense 115 and storage capacitors 120 unless the first switch is open and the second switch 150 closed. (If the first and second switches are both closed, the storage and sense capacitors would both simply charge from the voltage source 170.) Further, in order to transfer charge, the third switch 160 must be open or current would simply bypass the storage capacitor 120 and sink to ground. Thus, the storage capacitor may accept voltage from the sense capacitor 115 only when the first switch 140 is open, the second switch 150 closed, and the third switch 160 open.

Figure 3:
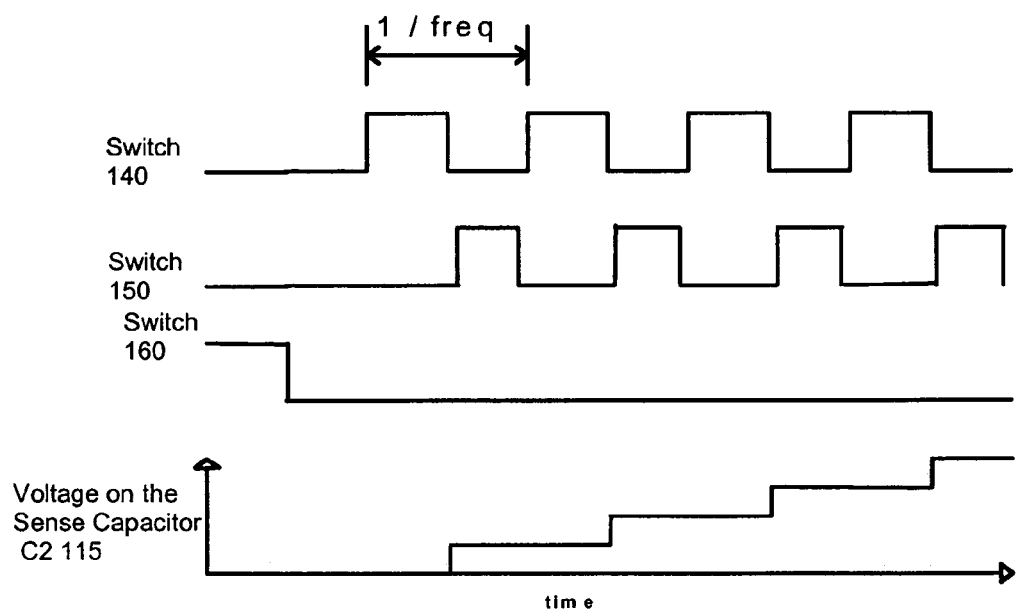
FIG. 3 is a timing diagram depicting the state operation of the circuit of FIG. 2.

FIG. 3 is a timing diagram depicting the operation of the various switches and the transfer of charge between capacitors. Initially, the first switch 140 is closed to charge the sense capacitor 115 to the potential of the voltage source 170 (hereinafter represented by "Vdd"). Once the sense capacitor 115 reaches voltage Vdd, the first switch is opened and the second switch 150 closed. This effectively transfers at least a portion of the charge from the sense capacitor to the storage capacitor 120. The charge transfer requires a current flow from the sense capacitor 115 through the storage capacitor 120, which in turn diminishes the voltage drop across the sense capacitor (i.e., the voltage measured at the common switch point).

The first switch 140 stays open and the second switch 150 stays closed for a time equal to 1 divided by twice the frequency f (i.e., 1/2f), at which point the switches reverse. That is, after 1/2f seconds, the first switch closes and the second switch 150 opens. The sense capacitor 115 again charges and the storage capacitor 120 enters a steady state, neither charging nor discharging, except incidentally, because the third switch 160 remains open. After time 1/2f seconds, the first switch 140 again opens and the second switch again closes, thus once more transferring charge from the sense capacitor 115 to the storage capacitor 120. In this manner, charge is discretely transferred from the sense capacitor to the storage capacitor.

It should be noted that FIG. 3 depicts the charge of the sense capacitor 115 as increasing in a stepwise fashion. This is a slight simplification for illustrative purposes. In actuality, the vertical portion of each "step" (reflecting the close of the second switch 150) is actually curvilinear, as charge is not instantaneously transferred between the capacitors.

Theoretically, charge may be transferred between capacitors until each capacitor is charged to the voltage of the voltage source 170, namely Vdd. However, and as shown in FIG. 2, a first input of a comparator 180 is electrically connected to the second switch 150 and storage capacitor 120. The comparator's second input is electrically connected to a second voltage source 170, which presents a threshold voltage to the comparator. When the voltages at the comparator's first and second inputs are equal, the comparator 180 activates and asserts a "stop counter" signal. When the stop counter signal is asserted, the third switch 160 closes.

Closing the third switch 160 effectively shorts the storage capacitor 120, dropping the voltage across the capacitor to zero. Thus, charge is drained from the storage capacitor when the third switch 160 closes. This ultimately resets the storage capacitor to its initial, zero-charge state. The third switch typically does not open until the charge of the storage capacitor 120 is zero.

In addition to draining all charge from the storage capacitor 120, closing the third switch 160 drops the voltage seen by the comparator's first terminal below the threshold voltage. Accordingly, closing the third switch also resets the comparator 180 and ends assertion of the stop counter signal.

Figure 4:
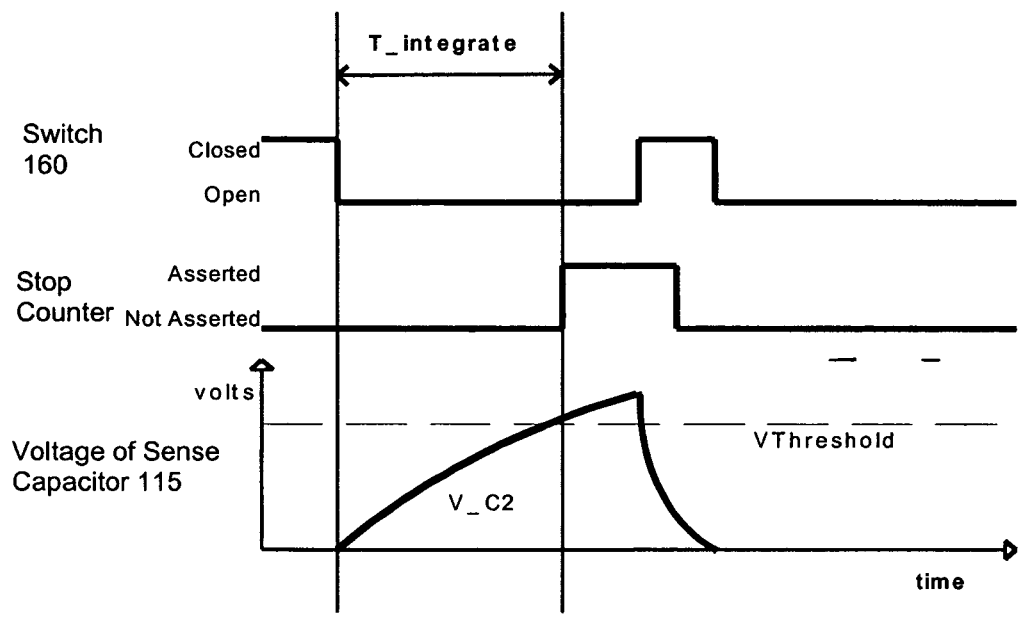
FIG. 4 is a timing diagram showing the charging and discharging of the sense capacitor.

FIG. 4 generally depicts a timing diagram, showing the charging and discharging of the sense capacitor 115. The time between the opening of the third switch 160 and the assertion of the stop counter equals the time taken to scan the entire electrode grid of the trackpad. This time is generally referred to herein as "T_integrate."

As is also apparent from FIG. 4, the third switch 160 actually closes some time after the stop counter is asserted. This is because the comparator 180 and switch are not ideal; a certain delay exists in the receipt and acknowledgement of the stop counter signal, as well as in the physical opening of the third switch. Thus, the storage capacitor 120 may often charge to a voltage above the threshold voltage. Further, the storage capacitor does not instantaneously discharge when the switch closes. Rather, it discharges its voltage at an increasingly slower rate, resulting in an exponential decay curve.

The switching circuit 125 model discussed with respect to FIGS. 2-4 may be simplified by substituting a resistor 130 for the first switch 140, second switch 150, and sense capacitor 115. Such a substitution reduces the circuit 125 to a basic resistive-capacitive (RC) circuit.

As previously mentioned, the first and second switches 150 sequentially close and open, with the first and second switches occupying different states. Each of the first and second switches completes an entire switching cycle (i.e., opens for a set time, then closes for the set time) at a frequency f. Accordingly, the charge transferred from the sense capacitor 115 to the storage capacitor 120 in a single cycle may be determined by applying the generic steady-state capacitance formula for a capacitor's charge to the present circuit 125. The generic capacitance formula is: $\Delta Q = \Delta V * C$. Applying this formula to the circuit shown in FIG. 2 yields: $\Delta Q_{C1} = (V_A - V_B) * C_1$, where $V_A$ is the voltage at point "A" of the circuit (i.e., Vdd), and $V_B$ is the voltage at point "B" of the circuit 125 (i.e., the voltage seen by the first input of the comparator 180. Similarly, $C_1$ is the capacitance of the sense capacitor 115, and $C_2$ (as discussed below) is the capacitance of the storage capacitor 120.

The current between point A and point B ($i_{AB}$) is generally:

$$i_{AB} = \frac{\Delta Q}{t} = \Delta Q * f$$

The change in charge $\Delta Q$ of the first capacitor may be substituted into this equation, such that:

$$i_{AB} = \frac{\Delta Q}{t} = \Delta Q * f = (V_A - V_B) * C_1 f$$

Figure 5:
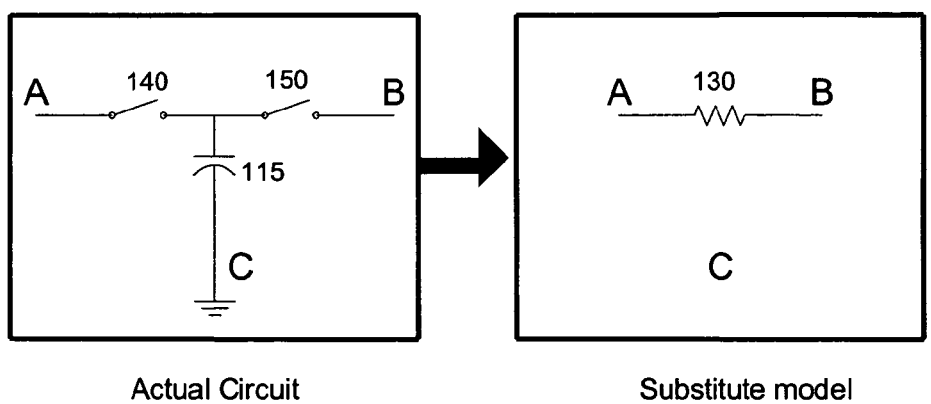
FIG. 5 depicts a resistor equivalent to a first switch, second switch, and first capacitor in the circuit of FIG. 2.

The capacitance of the sense capacitor 115 and the switching frequency f (i.e., scan frequency of the trackpad) are constants. Accordingly, the portion of the circuit 125 in FIG. 2 made of the first switch 140, second switch 150, and sense capacitor has a linear behavior with respect to current flow, just as does a resistor 130. The resistance of this circuit segment may be computed as follows:

$$i_{AB} = i_R = \frac{V_A - V_B}{R} = (V_A - V_B) * C_1 f$$

$$\frac{1}{R} = \frac{(V_A - V_B) * C_1 f}{V_A - V_B} = C_1 f$$

$$R = \frac{1}{C_1 f}$$

where R is the equivalent resistive value of the circuit segment. FIG. 5 depicts the circuit 125 of FIG. 2 with a resistor R 130 of equivalent resistance to the circuit segment substituted.

Replacing the first switch 140, second switch 150, and sense capacitor 115 with the equivalent resistor 130 permits relatively straightforward determination of the scan time T_integrate. Since the third switch 160 is a reset switch that closes only after the time T_integrate elapses, it is open from time zero until T_integrate is reached. Further, when the circuit 125 is initialized (i.e., time=zero), the voltage at point B is zero.

Given the value of the resistor 130 substituting for the first switch 140, second switch 150, and sense capacitor 115 (see FIG. 5), the integration time T_integrate may be determined. As previously discussed, the integration time is the amount of time required to charge the storage capacitor 120 to the voltage Vthreshold (i.e., the voltage required to trip the comparator 180).

Figure 6:
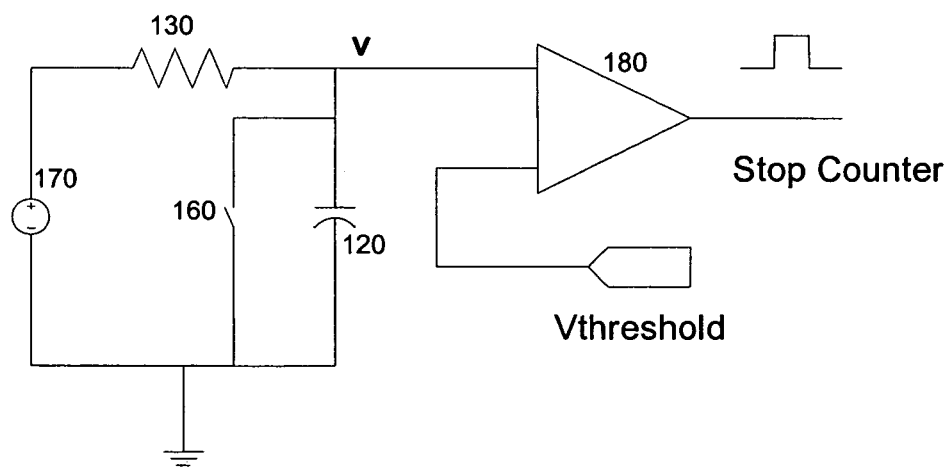
FIG. 6 depicts a resistive-capacitive circuit equivalent to the circuit of FIG. 2.

Certain operating conditions of the circuit 125 shown in FIG. 6 may prove useful in determining T_integrate. For example, since the third switch 160 only closes to discharge the storage capacitor 120 after T_integrate is reached, it may be presumed that the third switch 160 is open during the charging of the storage capacitor. Thus, the voltage at the second point (point B) is zero at time zero.

Generally, the time-varying voltage v(t) for an RC circuit 125 may be expressed as follows:

$$v(t) = v_\infty \left(1 - e^{\frac{-t}{RC}}\right)$$

Presuming the third switch 160 does not open, after infinite time, the voltage at the second point equals the input voltage of the RC circuit 125, or Vdd. Thus, specific solution for the circuit of FIG. 6 is:

$$v(t) = Vdd\left(1 - e^{\frac{-t}{RC_2}}\right)$$

This equation may be solved for the time necessary to trip the comparator 180, referred to herein as "$t_{trip}$." Definitionally, at this time the voltage v(t) equals the threshold voltage. Thus:

$$v(t) = Vthreshold = Vdd\left(1 - e^{\frac{-t_{trip}}{RC_2}}\right)$$

$$Vthreshold - Vdd\left(1 - e^{\frac{-t_{trip}}{RC_2}}\right)$$

$$\frac{Vthreshold}{Vdd} = 1 - e^{\frac{-t_{trip}}{RC_2}}$$

$$\frac{Vthreshold}{Vdd} - 1 = -e^{\frac{-t_{trip}}{RC_2}}$$

$$1 - \frac{Vthreshold}{Vdd} = e^{\frac{-t_{trip}}{RC_2}}$$

$$\ln\left(1 - \frac{Vthreshold}{Vdd}\right) = \frac{-t_{trip}}{RC_2}$$

$$RC_2^* \ln\left(1 - \frac{Vthreshold}{Vdd}\right) = -t_{trip}$$

$$-RC_2^* \ln\left(1 - \frac{Vthreshold}{Vdd}\right) = t_{trip}$$

Given a constant input voltage and threshold voltage, the integration time T_integrate may be expressed as a function of the resistor R 130 and the storage capacitor 120. Practically speaking, the sense electrodes 110 of any trackpad (or any other application) will always have an impedance greater than zero, and the sense capacitor 115 will always have a capacitance greater than zero. Thus, the time required to trip the comparator 180 will always be greater than zero. That is, in any practical application the time to trip the comparator will always occur after the start of the electrode grid scan process.

When a finger touches the trackpad surface, it is capacitively coupled to the electrode array at a corresponding point. Often, this is the intersection of sense electrodes 110 in the grid immediately beneath the finger, and possibly certain nearby intersections. This capacitive coupling between the sense electrode 100 in the array and the finger decreases the impedance of the electrode, and thus decreases the impedance of the corresponding resistor 130 in the equivalent circuit 125 of FIG. 6. The new impedance ($R_{new}$) of the resistor R may be determined from the combined capacitance of the finger ($C_{finger}$) and the sense capacitor 115 ($C_{sense}$), as follows:

$$C_{new} = C_{sense} + C_{finger}$$

$$R_{new} = \frac{1}{C_{new}f}$$

$$R_{new} = \frac{1}{(C_{sense} + C_{finger})f}$$

Since the impedance of the substitute resistor 130 changes, so too does the integration time T_integrate. The integration time for the RC circuit 125 of FIG. 6, without a user's finger proximal to the sense electrode 100 (i.e., touching the trackpad), also may be referred to as $t_{base}$. Similarly, the integration time for the RC circuit 125 when the finger is proximal to the trackpad may be referred to herein as $t_{finger}$. The change between the integration times $t_{base}$ and $t_{finger}$ is found by computing the two integration times and taking the difference:

$$t_{base} = -RC_2^* \ln\left(1 - \frac{Vthreshold}{Vdd}\right)$$

$$t_{finger} = -R_{new}C_2^* \ln\left(1 - \frac{Vthreshold}{Vdd}\right)$$

$$\Delta t = t_{base} - t_{finger}$$

$$\Delta t =$$

$$-RC_2^*\ln\left(1 - \frac{Vthreshold}{Vdd}\right) - \left(-R_{new}C_2 * \ln\left(1 - \frac{Vthreshold}{Vdd}\right)\right)$$

$$\Delta t = -RC_2^*\ln\left(1 - \frac{Vthreshold}{Vdd}\right) + R_{new}C_2 * \ln\left(1 - \frac{Vthreshold}{Vdd}\right)$$

$$\Delta t = C_2 * \ln\left(1 - \frac{Vthreshold}{Vdd}\right) * (R_{new} - R)$$

Thus, the change in integration time due to the finger's proximity to the trackpad is directly proportional to the capacitance of the storage capacitor 120. Accordingly, if the capacitance of the storage capacitor is increased, the base integration time, integration time when the finger is touching the trackpad, and the difference in integration times all increase. Accordingly, the integration time $t_{finger}$ increases more quickly than the integration time $t_{base}$.

Similarly, the integration time $t_{base}$ is directly proportional to the value of the resistor R 130, which represents the impedance of the sense electrode 100.

Finally, it should be noted that $\Delta t$ is proportional to the difference between the electrode impedances R and $R_{new}$. An increase in the storage capacitance $C_2$ results in a greater $\Delta t$.

Just as the integration time (either with or without a finger proximate the trackpad) may be calculated, so too may the sensitivity of the trackpad sensor 105. As used herein, the "sensitivity" of the sensor is defined as the ratio of the change in integration time due to a finger's presence (i.e., $\Delta t$, as described above) and the baseline integration time $t_{base}$. Expressed mathematically, a sensitivity S for the present RC circuit 125 equals:

$$S = \frac{\Delta t}{t_{base}}$$

$$S = \frac{C_2 * \ln\left(1 - \frac{Vthreshold}{Vdd}\right) * (R_{new} - R)}{-RC_2^* \ln\left(1 - \frac{Vthreshold}{Vdd}\right)}$$

$$S = \frac{(R_{new} - R)}{-R}$$

$$S = 1 - \frac{R_{new}}{R}$$

In other words, for the present circuit 125 (and thus the trackpad sensor 105 in general) sensitivity is proportional to the impedance of the sense electrode 100 with the finger present, divided by the impedance of the sense electrode alone. Substituting for the two impedances indicates the sensitivity may alternately be expressed as a function of the electrode and finger capacitances, as follows:

$$S = 1 - \frac{\frac{1}{(C_1 + C_{finger})f}}{\frac{1}{C_1 f}}$$

$$S = 1 - \frac{C_1 f}{(C_1 + C_{finger})f}$$

$$S = 1 - \frac{C_1}{(C_1 + C_{finger})}$$

If a default value is used for the finger's capacitance (such as an average or median value), the sensitivity may be relatively easily determined. Further, if the base integration time $t_{base}$ is known through calculation, estimation, or direct measurement, Δt may be calculated:

$$\Delta t = S * t_{base}$$

The sensitivity of the trackpad sensor 105 is essentially a measurement of how sensitive the trackpad is to the presence of a touching finger. The higher the sensitivity, the more easily the finger's presence may be detected. Accordingly, increasing a trackpad sensor's sensitivity will increase its ability to detect and properly position the finger. Thus, increasing the sensor's sensitivity will directly increase the performance of the sensor 105.

Reviewing the derivation of the change in integration time (i.e., Δt) indicates certain limitations on the operation of the RC circuit 125, and thus the basic trackpad sensor 105. First, increases of the integration time $t_{finger}$ require proportional increases in the baseline integration time $t_{base}$. For example, when a sensor must be repeatedly scanned at a relatively high sample rate, and thus requires a quick scan time, the baseline integration time $t_{finger}$ may be capped. This, in turn, limits the change in integration time and integration time when the finger is present ($t_{finger}$). In many present-art trackpad sensors, the change in electrode impedance due to the finger is around 1.2%, which is a relatively small change in impedance. As yet another example, the maximum storage value of a storage capacitor 120 employed in the trackpad may be limited by the available space, and thus, increasing the storage capacitance may not be an option available to increase sensitivity.

Second, in order to achieve an acceptable signal-to-noise ratio, high switching frequencies and storage capacitors 120 having a large capacitance are typically required. Both the high frequency and high-capacitance capacitor require additional power when compared to lower switching frequencies and lower-capacitance capacitors. Additionally, these factors may impact the sampling rate. Further, larger capacitors and high switching frequencies require certain mechanical considerations in the design and placement of the trackpad. Thus, where the capacitors are sufficiently large or the switching frequency too high, the resulting trackpad's size may be too large for inclusion in many computing systems. For example, a trackpad that is too thick, too wide, or too long may be too large in some dimension to be included in a notebook computer.

3. Current-Compensated Sensor Circuit

Current compensation may be added to the RC circuit 125 of FIG. 6 in order to increase sensitivity and maintain an acceptable signal-to-noise ratio, without increasing either capacitor size or sampling rate. Just as the RC circuit 125 may be current compensated as described below, so too may any sensor 105 that operates through capacitive coupling.

Figure 7:
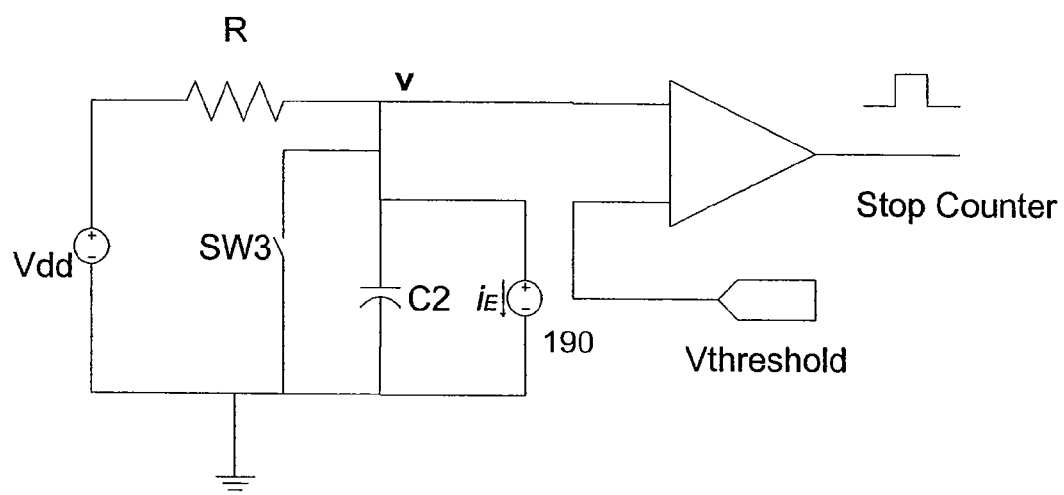
FIG. 7 depicts the circuit of FIG. 6 with a current sink connected thereto.

The current compensation discussed herein may be thought of as "negative" current compensation. That is, a current sink 190 may be added to the RC circuit to negatively compensate for current flowing through the storage capacitor 120. The current sink 190 effectively bleeds a constant current from the storage capacitor during the scanning process. FIG. 7 depicts an example of an RC circuit 195 corresponding to a trackpad sensor 105, with a current compensator/sink included.

The circuit 195 of FIG. 7 is similar to the circuit 125 depicted in FIG. 6. FIG. 7's RC circuit 195 again includes a voltage source 170, a resistor R 130 substituting for the first switch 140, second switch 150, and sense capacitor 115, a compensator, a third switch 160, and a storage capacitor 120. Also present, however, is the aforementioned current sink 190. Generally speaking, the current sink is connected across the storage capacitor in a manner similar to the third switch 160. The positive terminal of the current sink 190 is attached to the second point of the circuit 195, and the negative terminal is attached to ground. Thus, the current sink diverts current from the storage capacitor 120, draining current that would otherwise be available to charge the storage capacitor.

A brief discussion of the effect of the current sink 190 on the circuit 195, both when a finger touches the trackpad and when no finger is present, may prove useful in understanding the operation of the present embodiment 100.

First, presume a constant current is available in the RC circuit of FIG. 6 to charge the storage capacitor 120. Although the exact value of the constant current does not matter, for this example further presume the current is 10 milliamps. When a finger touches the trackpad, the capacitance of the sense capacitor 115 (FIG. 2) grows and the impedance of the equivalent resistor 130 R (FIG. 6) decreases. Thus, the current available to charge the storage capacitor 120 also increases. In the present example, presume the increased current with the finger proximate the trackpad is 11 milliamps. (Again, the exact value is irrelevant; all that matters is the fact that the current is greater when the finger touches the trackpad than when the finger is not present.) Since the charging rate of the storage capacitor 120 is a linear function of available current, the storage capacitor charges 10% faster when the finger touches the trackpad than when the finger does not touch the trackpad.

Next, consider the same circuit 195 with a current sink 190 in place, as shown in FIG. 7. Presuming the current sink is a 9 milliamp current source 170, 9 milliamps of current are drained that would otherwise be available to charge the storage capacitor 120. Thus, when the finger is not touching the trackpad, a single milliamp charges the storage capacitor. Similarly, when the finger is present, two milliamps charge the storage capacitor (since the finger's presence lowers the impedance sufficiently to provide a single milliamp of additional current at point B).

Accordingly, with the current sink 190 operating, twice the current is available to charge the storage capacitor 120 when a finger touches the trackpad than when no finger is present. In other words, the finger's presence provides a 100% increase in charge current.

In this manner, negative current compensation may increase the sensitivity of the sensing circuit 195 shown in FIG. 7. Additionally, because current is diverted from the storage capacitor 120, the current sink 190 may also increase the time T_integrate required to fully charge the storage capacitor to the threshold voltage and trip the comparator 180. Practically speaking, there must be sufficient current to charge the storage capacitor 120 in a timely manner (i.e., to charge the capacitor in a sufficiently short time to support the desired scan frequency). Within that parameter, however, negative current compensation may effectively increase the sensitivity of the trackpad sensor 105.

The increased sensitivity and integration time may be determined for the modified RC circuit 195 of FIG. 7. The primary difference between the integration time and sensitivity for the modified RC circuit, when compared to the RC circuit of FIG. 6, is the presence of the current sink 190.

Figure 8:
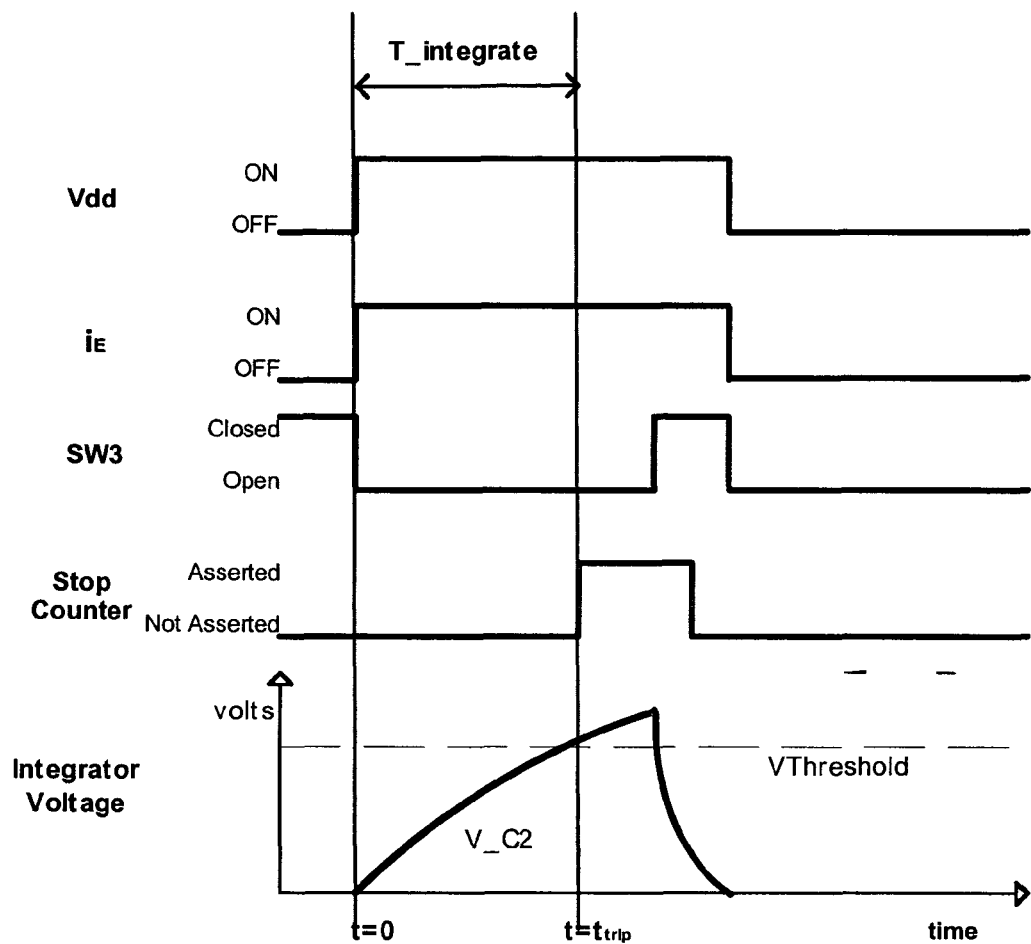
FIG. 8 depicts a timing diagram for the circuit of FIG. 7.

FIG. 8 depicts the initial conditions of the modified sensing circuit 195. As shown in FIG. 8, at the initial time (i.e., t=0) all voltage 170 and current sources 190, as well as the third switch 160, activate. The sources and switch remain on at least until the scan is complete after time T_integrate (i.e., at time $t_{trip}$). As with the unmodified sensing circuit 125 of FIG. 2, the voltage of the storage capacitor 120 may charge beyond the threshold voltage Vthreshold, because the third switch's closure may be delayed after the stop counter is asserted due to mechanical limitations.

Once the sensor 105 scan is complete, the circuit 195 completely resets before the next scan.

FIG. 9(*a*) depicts the time-domain representation of the modified sensor circuit 195, and FIG. 9(*b*) depicts the modified sensor circuit in the s-domain. As shown below, converting the modified circuit 195 into the s-domain simplifies the determination of the integration time.

Table 1 shows the time domain values and s-domain values for various circuit elements. Each of the time domain values may be converted to the corresponding s-domain value through application of a Laplace transform.

TABLE 1

| Element | Time Domain | s-Domain |
|---|---|---|
| Voltage Source | V(t) | V(s) |
| Current Source | I(t) | I(s) |
| Voltage across Resistor | i(t)*R | I(s)*R + $V_R(0)$ |
| Voltage across Capacitor | $C\frac{dv}{dt}$ | $I(s) * \frac{1}{Cs} + \frac{V(0)}{s}$ |
| Unit Step Function | u(t) | $\frac{1}{s}$ |

The voltage at the second point forms the starting point for derivation of the integration time for the current-compensated sensor circuit 195. Applying Kirchoff's Law to the voltage at the second point yields:

$$\frac{Vdd * u(t) - v(t)}{R} - C\frac{dv}{dt} - i_E u(t) = 0$$

$$\frac{Vdd * u(t) - v(t)}{R} = C\frac{dv}{dt} + i_E u(t)$$

The above formulae express the currents entering and leaving the charging node of the storage capacitor 120. The term "u(t)" denotes the unit step function, which models the turning on of the various sources 170, 190 (and the third switch 160) at time zero. In the time domain u(t)'s value is one at any time greater than zero. Thus, time-domain analysis may safely ignore the unit step function, since it simply represents multiplication by one in the above equations. The term "v(t)" represents the time-varying voltage at the second point.

In the s-domain, however, the activation of the various sources 170, 190 may not be ignored, insofar as they have an effect on the circuit model. The above equations in the time domain may be converted to the s-domain through the application of the appropriate transform, yielding the following::

$$\frac{Vdd * u(t) - v(t)}{R} = C\frac{dv(t)}{dt} + i_E u(t) \Rightarrow \frac{\frac{Vdd}{s} - v(s)}{R} = \frac{v(s)}{(sC_2)^{-1}} + \frac{i_E}{s}$$

Here, $i_E$ is the current generated by the current sink 190 (as shown in FIGS. 7 and 9(*a*)). Accordingly, it can already be seen that the current sink affects the voltage at the second point.

The s-domain calculation may be further simplified by isolating the s-domain voltage v(s) and separating terms, as follows:

$$\frac{\frac{Vdd}{s} - v(s)}{R} = \frac{v(s)}{(sC_2)^{-1}} + \frac{i_E}{s}$$

$$\frac{\frac{Vdd}{s} - v(s)}{R} = v(s) * sC_2 + \frac{i_E}{s}$$

$$\frac{Vdd}{s} - v(s) = v(s) * sRC_2 + \frac{Ri_E}{s}$$

$$\frac{Vdd - Ri_E}{s} = v(s) * sRC_2 + v(s)$$

$$\frac{Vdd - Ri_E}{s} = v(s)(sRC_2 + 1)$$

$$\frac{Vdd - Ri_E}{s(sRC_2 + 1)} = v(s)$$

$$\frac{(Vdd - Ri_E)\frac{1}{RC}}{s(sRC_2 + 1)\frac{1}{RC_2}} = v(s)$$

$$\frac{(Vdd - Ri_E)\frac{1}{RC_2}}{s\left(s + \frac{1}{RC_2}\right)} = v(s)$$

For convenience, one may define Vdd-$Ri_E$ to equal the variable A, and the variable $$\alpha = \frac{1}{RC_2}.$$

Given these definitions, the above equation for the voltage v(s) matches the generalized inverse Laplace transform:

$$v(t) = A(1 - e^{-\alpha t}) \Leftrightarrow v(s) = \frac{A\alpha}{s(s+\alpha)}$$

Figures 9A, 9B:
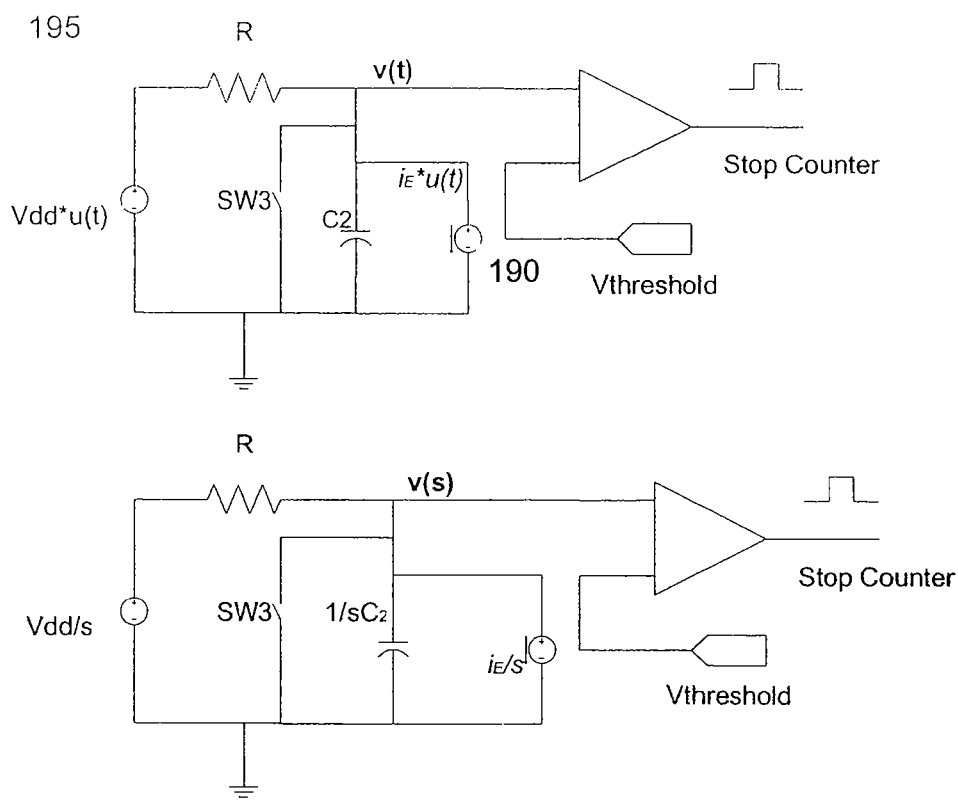
FIG. 9(a) depicts the circuit of FIG. 7 in a time-domain.
FIG. 9(b) depicts the circuit of FIGS. 7 and 9(a) in a s-domain.

The specific solution for the modified RC circuit 195 of FIG. 9(a) in the time domain is:

$$v(t) = (Vdd - Ri_E)\left(1 - e^{\frac{-t}{RC_2}}\right)$$

Given this generalized solution, the integration time T_integrate may be calculated. As previously discussed, the integration time is generally reached when the storage capacitor's voltage 120 reaches the threshold voltage (Vthreshold). Thus, once the above equation is solved for the time at which v(t) equals Vthreshold, the time T_integrate will be known. As before, since the circuit 195 of FIG. 9 does not include the changes to capacitance or resistance due to a finger's proximity, the time T_integrate for the present case will be referred to as "$t_{base}$."

$$v(t) = Vthreshold = (Vdd - Ri_E)\left(1 - e^{\frac{-t_{base}}{RC_2}}\right)$$

$$\frac{Vthreshold}{(Vdd - Ri_E)} = 1 - e^{\frac{-t_{base}}{RC_2}}$$

$$1 - \frac{Vthreshold}{(Vdd - Ri_E)} = e^{\frac{-t_{base}}{RC_2}}$$

$$\ln\left(1 - \frac{Vthreshold}{(Vdd - Ri_E)}\right) = \frac{-t_{base}}{RC_2}$$

$$-RC_2 \ln\left(1 - \frac{Vthreshold}{(Vdd - Ri_E)}\right) = t_{base}$$

As discussed previously, the proximate presence of a finger to the trackpad sensor 105 (i.e., sensor circuit 195 of FIG. 9) increases the impedance R of the electrode. To restate, the new impedance when the finger touches the trackpad sensor is the sum of the capacitances of the finger and the sense electrode 100, as follows:

$$C_{new} = C_1 + C_{finger}$$

$$R_{new} = \frac{1}{C_{new}f}$$

$$R_{new} = \frac{1}{(C_1 + C_{finger})f}$$

Given this data, the new values for $t_{base}$ and $t_{finger}$ in the circuit 195 of FIG. 9 may be derived. As shown below, these values are different from the previous values, due to the presence of the current sink/current compensator 190. Accordingly, the difference between the two times also changes:

$$t_{base} = -RC_2 * \ln\left(1 - \frac{Vthreshold}{Vdd - Ri_E}\right)$$

$$t_{finger} = -R_{new}C_2 * \ln\left(1 - \frac{Vthreshold}{Vdd - R_{new}i_E}\right)$$

$$\Delta t = t_{base} - t_{finger}$$

$$\Delta t = -RC_2 * \ln\left(1 - \frac{Vthreshold}{Vdd - Ri_E}\right) + R_{new}C_2 * \ln\left(1 - \frac{Vthreshold}{Vdd - R_{new}i_E}\right)$$

Unlike with respect to the circuit 125 of FIG. 6, the terms in the equations used to determine both $t_{base}$ and $t_{finger}$ do not combine and cancel. This is because both the natural logarithm term and RC term both change as the electrode impedance changes.

Given the change in time, the sensitivity of the current-compensated RC circuit 195 may be determined, as follows:

$$S = \frac{\Delta t}{t_{base}}$$

$$S = \frac{-RC_2 * \ln\left(1 - \frac{Vthreshold}{Vdd - Ri_E}\right) + R_{new}C_2 * \ln\left(1 - \frac{Vthreshold}{Vdd - R_{new}i_E}\right)}{-RC_2 * \ln\left(1 - \frac{Vthreshold}{Vdd - Ri_E}\right)}$$

$$S = 1 - \frac{R_{new}C_2 * \ln\left(1 - \frac{Vthreshold}{Vdd - R_{new}i_E}\right)}{RC_2 * \ln\left(1 - \frac{Vthreshold}{Vdd - Ri_E}\right)}$$

$$S = 1 - \frac{R_{new} * \ln\left(1 - \frac{Vthreshold}{Vdd - R_{new}i_E}\right)}{R * \ln\left(1 - \frac{Vthreshold}{Vdd - Ri_E}\right)}$$

The calculation for a current-compensated RC circuit 195 maybe compared to the sensitivity calculation for a non-current compensated RC, circuit, which is represented here by $S_{old}$:

$$S_{old} = \frac{R_{new}}{R}$$

$$S_{old} = 1 - \frac{C_1}{(C_1 + C_{finger})}$$

Contrasting the sensitivity of a non-current-compensated sensor circuit 125 with the sensitivity of a current-compensated circuit 195 reveals certain differences. The current-compensated circuit's sensitivity varies not only with the capacitance of the finger, but also on the ratio of natural logarithmic terms. The logarithmic terms, in turn, vary with the impedance of the circuit 195, as adjusted for the presence of the finger, multiplied by the compensating current produced by the current sink 190.

The above calculation may be simplified by substituting capacitances for the resistances, as follows:

$$S = 1 - \left(\frac{C_1}{C_1 + C_{finger}}\right) \frac{\ln\left(1 - \frac{Vthreshold}{Vdd - \frac{i_E}{(C_1 + C_{finger})f}}\right)}{\ln\left(1 - \frac{Vthreshold}{Vdd - \frac{i_E}{C_1 f}}\right)}$$

Thus, the sensitivity for a current-compensated sensing circuit 195 depends not only on electrode and finger capacitances, but also is affected by the compensating current. Indeed, as the compensating current increases (or more appropriately, as the negative compensating current increases), the sensitivity asymptotically increases as shown in FIG. 10.

Figure 10:
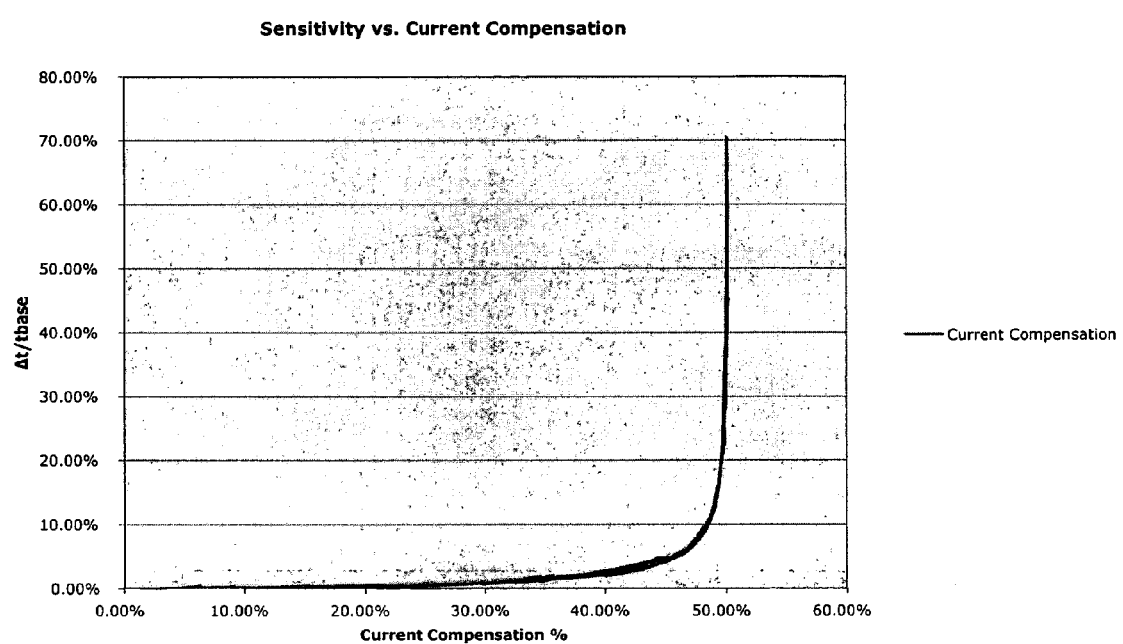
FIG. 10 is a graph of current compensation versus sensitivity.

As FIG. 10 depicts, the current compensation percentage of a current-compensated circuit 195 cannot exceed the ratio of Vthreshold to Vdd, insofar as the ratio of change in time to base integration time increases asymptotically. In FIG. 10, Vthreshold is 50% of Vdd, and thus the asymptote is at 50%. If Vthreshold were 75% of Vdd, then the current compensation percentage may be 75%. ("Base integration time" refers to the time T_integrate when no finger is proximate the trackpad sensor 105.) The graph of FIG. 10 expresses current compensation as a percentage of the current available to the storage capacitor 120 when no current sink 190 is included. Thus, if a storage capacitor sees a 6 milliamp current without any current sink implemented, the current sink 190 cannot provide a compensating current above three milliamps if the sensor circuit 195 is to continue to operate.

Generally speaking, current compensation operates best in sensor circuits 105 having a relatively low initial, non-compensated sensitivity. That is, current compensation may prove most useful where the non-compensated sensitivity is approximately 1.5% or below, for example. Given a low initial, non-compensated sensitivity, small absolute gains in sensitivity translate to large gain factors. For example, where the non-compensated sensitivity of a sensor circuit 105 is 1.5% and current compensation provides an additional 3% sensitivity gain, the gain factor is 3×.

Additionally, it should be noted that the addition of a current sink 190 to a sensor circuit 105 may increase temperature dependence in the circuit. As the circuit's temperature changes, so may the current compensation ratio of the modified circuit. This, in turn, may affect the gain of the modified circuit 195.

An illustration of a sensor's sensitivity to a finger's proximity may be useful in illustrating the effect of the current sink 190 on sensitivity. Referring again to the non-compensated circuit 125 of FIG. 6 and the compensated/modified circuit 195 of FIG. 9, sensitivity will be calculated for each, using the above formulae. Since the non-compensated circuit and modified circuit 195 are functionally identical except for the presence of the current sink, identical parameters will be used for both circuits. By using the same parameters, the difference in sensitivity between circuits will be solely due to current compensation. The various circuit parameters follow:

| Vdd: | 3.3 V |
|---|---|
| Vthreshold: | 1.6 V |
| Electrode self Capacitance (C1) | 40 pF |
| C2 (Integration cap) | 22 nF |
| Cfinger | 0.5 pF |
| f (switch frequency) | 12 MHz |

Given these values, the baseline time T_integrate (i.e., $t_{base}$) and resulting sensitivity $S_{on}$, as well as a number of counts necessary to charge the storage capacitor 120 to Vthreshold ($b_{ase}$). First, the baseline time and number of counts equal:

$$t_{base} = -RC_2 * \ln\left(1 - \frac{Vthreshold}{Vdd}\right), \text{ where } R = 1/C_1 f$$

$$t_{base} = \frac{-1}{C_1 f} C_2 * \ln\left(1 - \frac{Vthreshold}{Vdd}\right)$$

$$t_{base} = \frac{-1}{(40E-12F)*(12E6\,\text{Hz})}(22E-9F)*\ln\left(1 - \frac{1.6V}{3.3V}\right)$$

$$t_{base} = 30.4\,\mu s$$

$$n_{base} = 30.4\,us * f = 30.4\,us * 12\,\text{MHz} = 365 \text{ counts}$$

Next, sensitivity may be determined:

$$S = 1 - \frac{C_1}{(C_1 + C_{finger})}$$

$$S = 1 - \frac{40\,\text{pF}}{(40\,\text{pF} + 0.5\,\text{pF})}$$

$$S = 1.23\%$$

From these values, the change in time ($\Delta t$) and change in counts ($\Delta n$) may be determined:

$$\Delta t = S * t_{base} = 0.0123 * 30.4\,us = 0.375\,us$$

$$\Delta n = \Delta t * 12\,\text{MHz} = 4.5 \text{ counts}$$

Additionally, the scan time for any number of electrodes in the trackpad sensor 105 may be computed. Generally the scan time equals the base integration time multiplied by the number of electrodes. Accordingly, if one presumes the trackpad sensor 105 equivalent to the circuit of FIG. 6 has 48 electrodes, the scan time Scan would be:

$$t_{base} = 30.4\,\mu p$$

$$\text{electrodes} = 48$$

$$t_{scan} = t_{base} * \text{electrodes}$$

$$t_{scan} = 30.4\,\mu s * 48$$

$$t_{scan} = 1.46\,\text{ms}$$

A similar set of calculations may be made for the current-compensated circuit 195 of FIG. 9. Here, all circuit values are identical to those in the example above, and a 500 milliamp current sink 190 is applied. This results in a sensitivity of:

$$S = 1 - \left(\frac{C_1}{C_1 + C_{finger}}\right) \frac{\ln\left(1 - \frac{Vthreshold}{Vdd - \frac{i_E}{(C_1 + C_{finger})f}}\right)}{\ln\left(1 - \frac{Vthreshold}{Vdd - \frac{i_E}{C_1 f}}\right)}$$

-continued $$S = \frac{\ln\left(1 - \frac{1.6V}{3.3V - \frac{500E-6A}{40.5E-12\text{pF}*12E6\text{Hz}}}\right)}{1 - \left(\frac{40E-12\text{pF}}{40.5E-12\text{pF}}\right)\ln\left(1 - \frac{1.6V}{3.3V - \frac{500E-6A}{40E-12\text{pF}*12E6\text{Hz}}}\right)}$$

$$S = 2.33\%$$

As noted above, the sensitivity of the trackpad sensor 105 without current compensation is approximately 1.23%. The same sensor, with a compensating current of 500 milliamps applied, has approximately a 90% gain in sensitivity. The current-compensated sensitivity is 189% that of the non-compensated sensitivity at a power cost of 500 milliamps.

4. Conclusion

Current compensation may be applied to any capacitive sensor. For example, in addition to the two-dimensional sensor described herein, one-dimensional or point sensor may benefit from current compensation. A finger-actuated scroll pad may take the place of a mouse wheel and is one example of a one-dimensional sensor. Similarly, a touch-sensitive button or pad may detect whether or not a finger is touching it. Both devices' sensitivity may be increased through current compensation.

Additionally, it should be understood that the present invention may be integrated into any object, apparatus, or device that uses capacitance to detect a touching object. Thus, not only computer peripherals, but also security devices (such as keypads or fingerprint sensors), touch-sensitive remote controls, and other electronic devices may employ embodiments of the present invention.

Further, a variety of elements may operate as the current sink described herein. A switched capacitor, switched resistor, current follower, transistor, active current sink (such as an operational amplifier), traditional current source, or any combination of the above may act as a current sink in various embodiments of the present invention.

Although the present invention is described with a particular embodiment taking the form of a trackpad sensor 105, it should be understood that the inventive concepts described herein may be applied to a variety of electronic, capacitive-sensing devices. For example, biometric scanners and security devices (such as fingerprint scanners) may also benefit from current compensation. Similarly, it should be understood that yet another facet of the present invention is the methodology for matching a given current compensation with an existing or designed circuit to achieve a specific gain in sensitivity or to accommodate a particular power consumption. One may, for example, automate the various calculations described herein to operate on a computing device, or to take the form of computing hardware or computer-executable software, that can accept as an input a given circuit design and provide as an output a design for a current-compensated circuit.

Further, although the present invention has been described with respect to particular embodiments and methods of operation, additional embodiments and methods of operation will be apparent to those skilled in the art upon reading this disclosure. Accordingly, the proper scope of this invention is defined by the appended claims.

We claim:

1. A sensor circuit, comprising:
   at least a first electrode;
   a storage device operatively connected to the first electrode;
   a source operative to charge at least the first electrode; and
   a current source operatively connected to the storage device and sinking a portion of a current while a remainder of the current is charging the storage device; wherein the storage device is charged from the first electrode.

2. The sensor circuit of claim 1, wherein the storage device is a capacitor.

3. The sensor circuit of claim 1, further comprising:
   a surface overlaying the at least one electrode; wherein
   the surface is operative to capacitively couple a finger touching the surface to the first electrode.

4. The sensor circuit of claim 3, wherein the tracking sensor operates in at least one dimension.

5. The sensor circuit of claim 1, wherein the sensor circuit is a tracking sensor.

6. The sensor circuit of claim 1, wherein the sensor is a touch button.

7. The sensor circuit of claim 6, wherein the tracking sensor operates in two dimensions.

8. The sensor circuit of claim 1, wherein the current source comprises a switched capacitor.

9. The sensor circuit of claim 1, wherein the current source comprises a switched resistor.

10. The sensor circuit of claim 1, wherein the current source comprises a current follower.

11. The sensor circuit of claim 1, wherein the sensor circuit comprises an active current sink.

12. The sensor circuit of claim 1, further comprising a comparator operatively connected to the storage device.

13. The sensor circuit of claim 12, further comprising a switch operatively connected to the storage device.

14. The sensor circuit of claim 13, wherein:
   the comparator is operative to close the switch when the storage device reaches a preset voltage; and
   the switch is operative to drain a voltage from the storage device when the switch closes.

15. The sensor circuit of claim 14, further comprising:
   a first switch connected between the first electrode and the voltage source; and
   a second switch connected between the first electrode and second electrode; wherein
   the opening and closing of the first and second switches is operative to charge the first and second electrodes at a given frequency.

16. A method for determining a presence of a finger, comprising:
   charging a storage capacitor for a first time while a first voltage is negatively compensated by a current sink by sinking a portion of a current while a remainder of the current charges the storage capacitor;
   discharging the storage capacitor;
   charging the storage capacitor for a second time;
   comparing the first time to the second time; and
   in the event the second time is less than the first time, concluding a finger is present.

17. The method of claim 16, wherein the step of charging a capacitor a first time comprises:
   charging the storage capacitor from a current generated by a sense capacitor at a given frequency.

18. The method of claim 17, wherein the step of charging the storage capacitor a second time comprises:
   charging the storage capacitor from a current generated by a sense capacitor at a given frequency; and
   negatively compensating the current before the current charges the storage capacitor.

19. The method of claim 18, further comprising charging the sense capacitor at a given frequency from a voltage source.

20. The method of claim 19, wherein the application of the negative compensation to the current increases a sensitivity of the sense capacitor to the presence of a finger.

21. The method of claim 20, further comprising:
   determining whether a voltage of the storage capacitor exceeds a threshold voltage;
   in the event the voltage of the storage capacitor exceeds the threshold voltage, closing a switch; and
   in response to closing the switch, resetting the voltage of the storage capacitor.

22. The method of claim 21, wherein:
   the operation of negatively compensating the current comprises:
   connecting the current source and the storage capacitor to a common node; and
   draining at least a portion of the current from the common node such that the drained portion of the current cannot charge the storage capacitor.

23. The method of claim 16, wherein the current is negatively compensated by applying a current source to the current.

* * * * *